United States Patent
Lee

(10) Patent No.: US 10,892,527 B2
(45) Date of Patent: Jan. 12, 2021

(54) APPARATUS AND METHOD FOR DETECTING FAILURE OF BATTERY PACK

(71) Applicant: LG CHEM, LTD., Seoul (KR)

(72) Inventor: Jonggon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 90 days.

(21) Appl. No.: 16/307,754

(22) PCT Filed: Aug. 28, 2017

(86) PCT No.: PCT/KR2017/009371
§ 371 (c)(1),
(2) Date: Dec. 6, 2018

(87) PCT Pub. No.: WO2018/048128
PCT Pub. Date: Mar. 15, 2018

(65) Prior Publication Data
US 2019/0267679 A1    Aug. 29, 2019

(30) Foreign Application Priority Data
Sep. 9, 2016 (KR) .......... 10-2016-0116602

(51) Int. Cl.
*H01M 10/48* (2006.01)
*G01R 19/165* (2006.01)
(Continued)

(52) U.S. Cl.
CPC .......... *H01M 10/48* (2013.01); *B60L 50/60* (2019.02); *G01R 19/16542* (2013.01);
(Continued)

(58) Field of Classification Search
CPC ...... H01M 10/48; H01M 10/46; H01M 10/50; G01R 31/327; G01R 31/40
See application file for complete search history.

(56) References Cited

U.S. PATENT DOCUMENTS

| | | | |
|---|---|---|---|
| 2004/0061503 A1* | 4/2004 | Morimoto | B60K 6/28 324/418 |
| 2012/0105065 A1 | 5/2012 | Namou et al. | |

(Continued)

FOREIGN PATENT DOCUMENTS

| | | |
|---|---|---|
| CN | 101826737 A | 9/2010 |
| CN | 102810892 A | 12/2012 |

(Continued)

OTHER PUBLICATIONS

International Search Report (PCT/ISA/210) issued in PCT/KR2017/009371, dated Dec. 7, 2017.
Extended European Search Report for European Application No. 17849012.4, dated Mar. 22, 2019.

*Primary Examiner* — Kenneth J Douyette
(74) *Attorney, Agent, or Firm* — Birch, Stewart, Kolasch & Birch, LLP

(57) ABSTRACT

A battery management system includes a first battery pack which supplies power to a load, a first ground unit which is connected between a first relay which is connected to the first battery pack to connect and disconnect power supply of the battery pack and the first battery pack, a second battery pack which supplies power to a load, a second ground unit which is connected between a second relay which is connected to the second battery pack to connect and disconnect power supply of the battery pack and the second battery pack and a voltage measuring unit which measures voltages of both ends of the first relay and voltages of both ends of the second relay.

5 Claims, 4 Drawing Sheets

(51) Int. Cl.
  G01R 31/327 (2006.01)
  G01R 31/40 (2020.01)
  B60L 50/60 (2019.01)

(52) U.S. Cl.
  CPC ......... G01R 31/3278 (2013.01); G01R 31/40 (2013.01); *Y02T 10/70* (2013.01)

(56) References Cited

U.S. PATENT DOCUMENTS

| | | |
|---|---|---|
| 2012/0191294 A1 | 7/2012 | Boiron et al. |
| 2013/0140886 A1 | 6/2013 | Bito |
| 2013/0342214 A1 | 12/2013 | Lin |
| 2014/0333311 A1 | 11/2014 | Liu et al. |
| 2014/0354054 A1 | 12/2014 | Katou |
| 2015/0346282 A1 | 12/2015 | Jeon |
| 2016/0336736 A1 | 11/2016 | Nomura et al. |

FOREIGN PATENT DOCUMENTS

| | | |
|---|---|---|
| DE | 102011054461 A1 | 5/2012 |
| DE | 112014005878 T5 | 9/2016 |
| EP | 1335484 A2 | 8/2003 |
| EP | 2696502 A2 | 2/2014 |
| JP | 7-296695 A | 11/1995 |
| JP | 2900036 B2 | 6/1999 |
| JP | 2010-533361 A | 10/2010 |
| KR | 10-2014-0013250 A | 2/2014 |
| KR | 10-2014-0125971 A | 10/2014 |
| KR | 10-2014-0136844 A | 12/2014 |
| KR | 10-2015-0025428 A | 3/2015 |
| KR | 10-2015-0137677 A | 12/2015 |
| WO | WO 2009/011748 A1 | 1/2009 |
| WO | WO 2011/010026 A1 | 1/2011 |
| WO | WO 2011/148752 A1 | 12/2011 |

\* cited by examiner

Prior Art

[Figure 2]
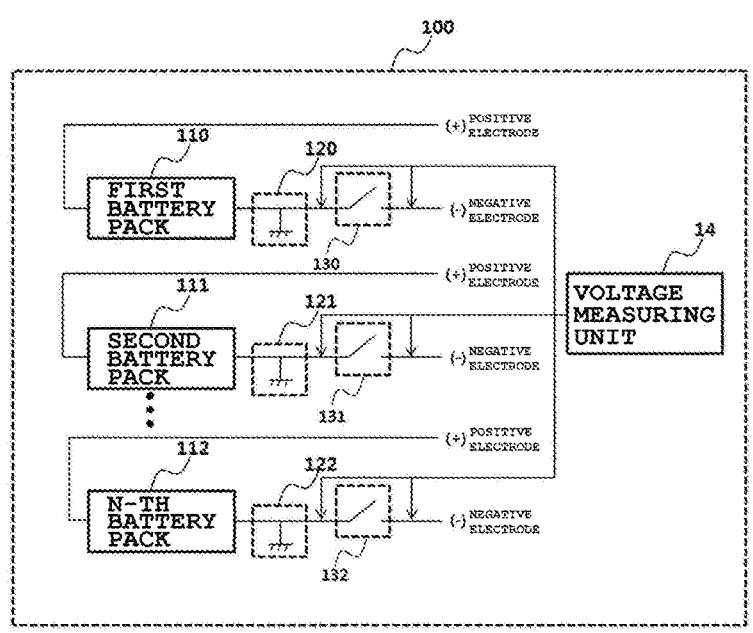

[Figure 3]
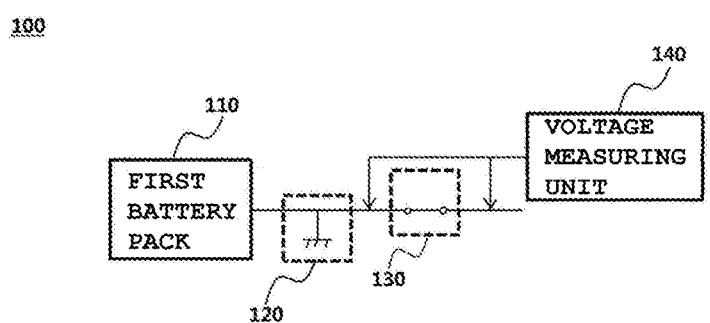

[Figure 4]
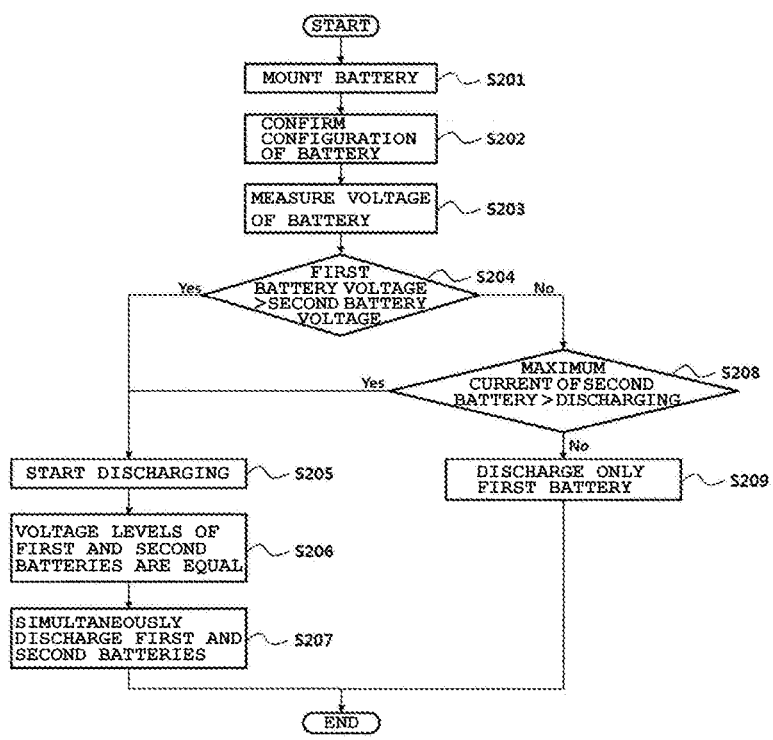

APPARATUS AND METHOD FOR DETECTING FAILURE OF BATTERY PACK

TECHNICAL FIELD

This application claims priority to and the benefit of Korean Patent Application No. 10-2016-0116602 filed in the Korean Intellectual Property Office on Sep. 9, 2016, the entire contents of which are incorporated herein by reference.

The present invention relates to apparatus and method for detecting failure of battery pack using an independent ground unit, and more particularly, to an apparatus for detecting a failure of a battery pack using an independent ground unit which includes an independent ground unit between a battery pack and a relay and measures voltages of both ends of the relay to detect failure of the relay based on the measured value and a method for detecting a failure of a battery pack.

BACKGROUND ART

In a battery for a vehicle, a secondary cell is used as an energy source of a driving motor which drives a vehicle.

Generally, the secondary cell is formed with a configuration in which a plurality of unit battery packs is connected in parallel and the battery packs share one ground unit.

In the meantime, in a structure in which a plurality of battery packs connected in parallel uses one ground unit, even when failure occurs in a relay, a voltage difference between both ends of the relay is not generated due to the combined ground unit so that the failure of the relay cannot be detected.

DETAILED DESCRIPTION OF THE INVENTION

Technical Problem

The present invention is conceived to solve the above described problem and an object of the present invention is to provide an apparatus for detecting a failure of a battery pack which includes an independent ground unit between a battery pack and a relay to detect failure of the relay by a voltage difference at both ends of the relay when failure occurs in the relay and a method for detecting a failure of a battery pack.

Technical Solution

According to an exemplary embodiment of the present invention, an apparatus for detecting a failure of a battery pack includes a first battery pack which supplies power to a load; a first ground unit which is connected between a first relay which is connected to the first battery pack to connect and disconnect power supplying of the battery pack and the first battery pack; a second battery pack which supplies power to a load; a second ground unit which is connected between a second relay which is connected to the second battery pack to connect and disconnect power supplying of the battery pack and the second battery pack; and a voltage measuring unit which measures voltages of both ends of the first relay and voltages of both ends of the second relay, In an exemplary embodiment, the first and second ground units may make differences of voltages of both ends of the first and second relays by making a voltage between the first and second battery packs and the first and second relays be a reference voltage in order to detect failure of the first and second relays.

In an exemplary embodiment, the voltage measuring unit may be connected to both ends of each of the first and second relay to measure a voltage.

In an exemplary embodiment, the voltage measuring unit may detect failure of the first and second relays based on the voltage measurement result.

According to another exemplary embodiment of the present invention, a method of detecting failure by a power supply device includes: controlling a first relay and a second relay to close the first relay whose one end is connected to a first ground unit and the second relay whose one end is connected to a second ground unit; measuring a voltage at both ends of the first relay and a voltage at both ends of the second relay; determining whether the measured voltages of both ends of the first relay are equal to each other and the measured voltages of both ends of the second relay are equal to each other; and detecting failure of the first and second relays based on a determination result.

In an exemplary embodiment, when voltages of both ends of any of the first and second relays are not equal to each other, the detecting of failure of the first and second relays may include detecting a relay in which voltages of both ends are not equal to each other as a failure relay.

Advantageous Effects

The apparatus for detecting a failure of a battery pack according to the exemplary embodiment of the present invention includes an independent ground unit between each battery pack and a relay connected to the battery pack to detect the failure of the relay by a voltage difference at both ends of each relay so that failure of the relay which is not detected when the relay is closed by the combined ground unit in an existing power supply device is detected.

Further, since the failure of the relay is detected by measuring a voltage, a separate configuration to detect failure of the relay is not necessary so that a manufacturing cost of a circuit is saved.

BRIEF DESCRIPTION OF DRAWINGS

FIG. 2 is a view schematically illustrating an apparatus for detecting a failure of a battery pack which is capable of detecting failure of a relay.

FIG. 3 is a view illustrating a failure detecting operation procedure of an apparatus for detecting a failure of a battery pack.

FIG. 4 is a view schematically illustrating an apparatus for detecting a failure of a battery pack according to an exemplary embodiment of the present invention which is capable of detecting failure of a relay.

BEST MODE

Figure 1:
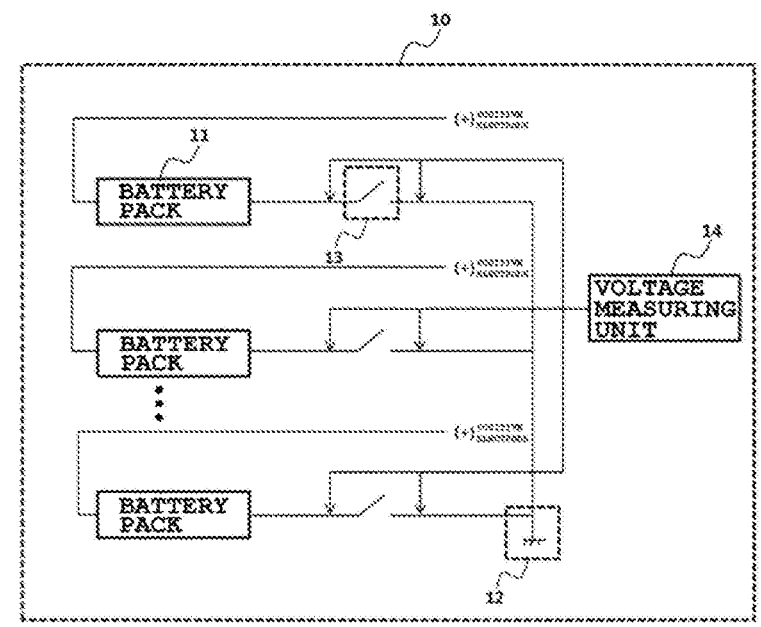
FIG. 1 is a view schematically illustrating a configuration of a battery pack device of the related art.

The present invention will be described in detail below with reference to the accompanying drawings. Herein, repeated description and the detailed description of a known function and configuration that may make the purpose of the present invention unnecessarily ambiguous will be omitted. Exemplary embodiments of the present invention are provided so that those skilled in the art may more completely understand the present invention. Accordingly, the shape, the size, etc., of elements in the figures may be exaggerated for explicit comprehension.

In the specification, unless explicitly described to the contrary, the word "comprise" and variations such as "comprises" or "comprising" will be understood to imply the inclusion of stated elements but not the exclusion of any other elements.

In addition, the term "-unit" described in the specification means a unit for processing at least one function and operation and can be implemented by hardware components or software components or combinations thereof.

FIG. 1 is a view schematically illustrating a configuration of a battery pack device 10 of the related art.

Referring to FIG. 1, the battery pack device 10 includes a battery pack 11, a ground unit 12, a relay 13, and a voltage measuring unit 14.

The battery pack device 10 may be formed such that one or more battery packs 11 are connected in parallel.

One or more battery packs 11 supply power to a load and include a separate charging unit to charge the battery pack 11.

Here, the load may mean an electric vehicle, a hybrid vehicle, a plug-in hybrid vehicle, an uninterruptible power supply, or an energy storage system.

Further, one or more battery packs 11 may be connected to one or more relays 13, respectively.

Further, one or more battery packs 11 may include a ground unit 12 connected in one.

Further, the relay 13 may connect or disconnect power supplying of the battery pack 11 which is supplied to the load.

Here, the voltage measuring unit 14 may selectively measure voltages of one or more relays 13.

The above-described battery pack device 10 is different from a structure of the apparatus 100 for detecting a failure of a battery pack of the exemplary embodiment in that the ground unit 12 connected in one is provided and one or more battery packs 11 connected in parallel are connected through a common ground unit.

Here, when the battery pack device 10 is controlled to close the relay to supply power from the battery pack to the load, if the relay normally operates, voltages of both ends of the relay need to be equal to each other. Here, when failure occurs in the relay so that when the relay is not normally closed, a voltage difference is generated at both ends of the relay.

However, in order to detect failure caused in the relay 13, the voltage difference at both ends of the relay needs to be generated. However, generally, a common ground unit 12 is used for a board on which a circuit of the battery pack device 10 is configured. In this case, one end of each of the relays 13 is connected to a common ground unit 12 to have the same voltage so that the voltage measuring unit 14 may not individually detect which relay has failure.

Here, the failure may mean contact fusing in the relay due to a high temperature of the relay, contact movement due to frequent opening and closing of the relay, increase of a contact resistance due to deformation of a contact unit of the relay, a contact failure of the relay due to abnormal current and voltage, and the like.

FIG. 2 is a view schematically illustrating an apparatus for detecting a failure of a battery pack which is capable of detecting failure of a relay according to an exemplary embodiment.

An apparatus 100 for detecting a failure of a battery pack according to an exemplary embodiment includes a first battery pack 110, a second battery pack 111, a N-th battery pack 112, a first ground unit 120, a second ground unit 121, a N-th ground unit 122, a first relay 130, a second relay 131, a N-th relay 132, and a voltage measuring unit 14.

The first battery pack 110, the second battery pack 111, and the N-th battery pack 112 are connected in parallel and supply power to the load.

Each of the first battery pack 110, the second battery pack 111, and the N-th battery pack 112 may be formed such that one or more battery cells are connected in series and parallel.

Further, a type of battery cells which configure the first battery pack 110, the second battery pack 111, and the N-th battery pack 112 is not limited. For example, the battery cell may be configured by a lead storage battery, a nickel-cadmium battery, a nickel hydrogen storage battery, a lithium ion battery, or a lithium ion polymer battery.

The first relay 130, the second relay 131, and the N-th relay 132 are connected to the battery pack to connect or disconnect the power of the battery pack which is supplied to the load.

More specifically, when the first relay 130, the second relay 131, and the N-th relay 132 are closed, the connected first battery pack 110, second battery pack 111, and N-th battery pack 112 are connected to the load to supply power to the load. When the relays are open, the first battery pack 110, the second battery pack 111, and the N-th battery pack 112 are disconnected from the load to perform an operation of disconnecting the power from the load.

The voltage measuring unit 14 is connected to both ends of one or more relays 13 to measure the voltages.

Here, the types of first relay 130, second relay 131, and N-th relay 132 are not limited and for example, may be configured by a mechanical relay, a photoMOS relay, or a solid state relay.

Relays are additionally configured at positive electrodes of the first battery pack 110, the second battery pack 111, and the N-th battery pack 112 to be controlled together with the relays which are previously connected to the respective battery packs.

The first ground unit 120, the second ground unit 121, and the N-th ground unit 122 may be separately provided between the battery packs and the relays such that the ground units are not connected to each other. The first to N-th ground units 120, 121, and 122 may separately make the voltage between the battery pack and the relay be a reference voltage. Further, in FIG. 1, even though the first ground unit 120, the second ground unit 121, and the N—the ground unit 122 are provided between the battery packs and the relays, in some exemplary embodiments, the relay may be provided between the battery pack and the ground unit.

The voltage measuring unit 14 is connected to both ends of one or more relays such as the first relay 130, the second relay 131, and the N-th relay 132 to measure the voltages thoseof. The voltage measuring unit 14 measures the voltage of each relay whose one end is connected to the separate ground unit to separately measure the voltages of the relays to individually detect the failure of the relay. As described above, the voltage measuring unit 14 controls the relay to be closed and then measure whether voltages of both ends of each relay are equal to each other so that the failure of each relay may be detected according to the voltage measurement result.

FIG. 3 is a view illustrating a failure detecting operation procedure of an apparatus for detecting a failure of a battery pack, and FIG. 4 is a view schematically illustrating an apparatus for detecting a failure of a battery pack according to an exemplary embodiment of the present invention which is capable of detecting failure of a relay.

Referring to FIGS. 3 and 4, first, a relay is controlled such that a first relay 130 to which a first ground unit 110 is connected is closed (S201).

The voltage measuring unit 140 is connected to both ends of the first relay 130 to measure voltages of both ends of the first relay 130 (S202) and compares the voltages values of both ends of the first relay 130 to determine whether the voltages are equal to each other (S203).

When it is determined that the voltage values measured at both ends of the first relay 130 are not equal to each other, the failure of the first relay 130 may be detected (S204).

In contrast, when it is determined that the voltage values measured at both ends of the first relay 130 are equal to each other, the voltage measuring unit 14 measures voltages of both ends of the first relay 130 again.

Similarly, in step S202, the voltage measuring unit 140 is connected to both ends of the second relay 231 to separately measure voltages of both ends of the second relay 231. Next, the voltage measuring unit 140 determines whether voltages of both ends of the second relay 231 are different from each other in step S203 based on a result obtained by measuring the voltages of both ends of the second relay 231 to detect whether the second relay has failure (S204).

While a specific embodiment of the present invention has been illustrated and described, it is obvious to those skilled in the art that the technical spirit of the present invention is not limited to the accompanying drawings and the above description and various modifications may be made without departing from the spirit of the present invention. Further, it is understood that such modifications will be covered by the claims of the present invention within the spirit of the present invention.

The invention claimed is:

1. A power supply device, comprising:
a first battery pack configured to supply power to a load;
a first ground unit connected between a first relay and the first battery pack, wherein the first relay is connected to the first battery pack to connect and disconnect power supply of the first battery pack;
a second battery pack configured to supply power to the load;
a second ground unit connected between a second relay and the second battery pack, wherein the second relay is connected to the second battery pack to connect and disconnect power supply of the second battery pack; and
a voltage measuring unit configured to measure voltages of both ends of the first relay and voltages of both ends of the second relay,
wherein the first relay is separate from the first battery pack,
wherein the first ground unit is separate from the first battery pack,
wherein the second relay is separate from the second battery pack,
wherein the second ground unit is separate from the second battery pack,
wherein the first ground unit and the second ground unit are separately provided, and
wherein the first ground unit is not connected to the second ground unit.

2. The power supply device of claim 1, wherein the first ground unit determines a reference voltage of the first relay to be a voltage difference between the first relay and the first battery pack,
wherein the second ground unit determines a reference voltage of the second relay to be a voltage difference between the second relay and the second battery pack, and
wherein the voltage measuring unit uses the respective reference voltage to detect a failure of the first and second relays.

3. The power supply device of claim 1, wherein the voltage measuring unit is connected to both ends of each of the first and second relay to measure a voltage.

4. The power supply device of claim 3, wherein the voltage measuring unit detects failure of the first and second relays based on the measured voltage.

5. The power supply device of claim 1, wherein the first battery pack and the second battery pack are connected in parallel.

* * * * *